(12) United States Patent
Wong et al.

(10) Patent No.: US 10,785,896 B2
(45) Date of Patent: Sep. 22, 2020

(54) COOLING A DATA CENTER

(71) Applicant: Google LLC, Mountain View, CA (US)

(72) Inventors: Eehern J. Wong, Sunnyvale, CA (US);
Pascal Kam, Union City, CA (US);
Thomas R. Kowalski, Santa Cruz, CA (US); Ron Drew, Cumming, GA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/453,669

(22) Filed: Jun. 26, 2019

(65) Prior Publication Data

US 2019/0320558 A1    Oct. 17, 2019

Related U.S. Application Data

(62) Division of application No. 14/956,595, filed on Dec. 2, 2015, now Pat. No. 10,342,163.

(51) Int. Cl.
*H05K 7/20* (2006.01)
*H05K 7/14* (2006.01)

(52) U.S. Cl.
CPC ....... *H05K 7/20745* (2013.01); *H05K 7/1492* (2013.01); *H05K 7/2079* (2013.01); *H05K 7/20836* (2013.01)

(58) Field of Classification Search
CPC ............... H05K 7/1492; H05K 7/2079; H05K 7/20836; H05K 7/20745
See application file for complete search history.

(56) References Cited

U.S. PATENT DOCUMENTS

| | | | |
|---|---|---|---|
| 5,791,408 A | 8/1998 | Seem | |
| 7,046,514 B2 * | 5/2006 | Fink | H05K 7/20745 361/695 |

(Continued)

FOREIGN PATENT DOCUMENTS

| | | |
|---|---|---|
| CA | 2783897 | 1/2014 |
| CN | 102762926 | 10/2012 |

(Continued)

OTHER PUBLICATIONS

Extended European Search Report in European Application No. 16199365.4, dated Mar. 29, 2017, 8 pages.

(Continued)

*Primary Examiner* — Hoa C Nguyen
*Assistant Examiner* — Keith DePew
(74) *Attorney, Agent, or Firm* — Fish & Richardson P.C.

(57) ABSTRACT

A data center cooling system includes a plurality of server racks aligned within a row in a human-occupiable workspace of a data center, the server racks supporting a plurality of heat-generating computing devices; a warm air aisle positioned adjacent the server racks opposite the human-occupiable workspace and including a warm air inlet adjacent to a back side of the row of server racks and a warm air outlet in fluid communication with a warm air plenum; a plurality of cooling modules each including at least one fan and a cooling coil; and a controller to perform operations including controlling the plurality of fans in the plurality of cooling modules to operate at a specified fan speed, and controlling a plurality of valves fluidly coupled to the plurality of cooling coils in the plurality of cooling modules to modulate to a specified valve position.

37 Claims, 4 Drawing Sheets

(56) References Cited

U.S. PATENT DOCUMENTS

| | | | |
|---|---|---|---|
| 7,439,634 B2 | 10/2008 | Michalko | |
| 7,527,468 B2 | 5/2009 | Hopkins | |
| 7,597,534 B2 | 10/2009 | Hopkins | |
| 8,147,302 B2 | 4/2012 | Desrochers et al. | |
| 8,414,251 B2 | 4/2013 | Hopkins | |
| 8,469,782 B1* | 6/2013 | Roy | H05K 7/20745 454/184 |
| 9,661,782 B2* | 5/2017 | Rodriquez | H05K 5/0213 |
| 9,670,689 B2* | 6/2017 | Dechene | E04H 5/02 |
| 10,211,630 B1* | 2/2019 | Clidaras | H02J 1/12 |
| 2006/0121421 A1* | 6/2006 | Spitaels | G06F 1/206 434/118 |
| 2009/0287949 A1* | 11/2009 | Bradicich | G06F 1/3203 713/340 |
| 2010/0290197 A1 | 11/2010 | Bergthold | |
| 2011/0100045 A1* | 5/2011 | Carlson | F25D 16/00 62/259.2 |
| 2011/0100618 A1 | 5/2011 | Carlson | |
| 2011/0106276 A1 | 5/2011 | Donnell | |
| 2011/0234015 A1 | 9/2011 | Chang | |
| 2011/0307102 A1* | 12/2011 | Czamara | H05K 7/1497 700/277 |
| 2013/0037254 A1* | 2/2013 | Carlson | F24F 11/0001 165/287 |
| 2013/0040547 A1 | 2/2013 | Moore | |
| 2013/0111937 A1 | 5/2013 | Hendrix | |
| 2013/0201618 A1 | 8/2013 | Czamara et al. | |
| 2013/0213071 A1 | 8/2013 | Takahashi | |
| 2013/0233532 A1* | 9/2013 | Imwalle | H05K 7/20836 165/287 |
| 2014/0014292 A1* | 1/2014 | Rice | H05K 7/20836 165/11.1 |
| 2014/0103713 A1 | 4/2014 | Chen | |

FOREIGN PATENT DOCUMENTS

| | | |
|---|---|---|
| CN | 102762927 | 10/2012 |
| CN | 102884876 | 1/2013 |
| CN | 103140718 | 6/2013 |
| CN | 103547122 | 1/2014 |
| CN | 104024975 | 9/2014 |

OTHER PUBLICATIONS

CN Office Action in Chinese Appln. No. 201611101244.4, dated Apr. 9, 2019, 28 pages.

Extended European Search Report in European Application No. 19153554, dated Jun. 18, 2019, 8 pages.

CN Office Action in Chinese Application No. 201611101244.4, dated Oct. 12, 2019, 19 pages (with English translation).

CN Office Action in Chinese Application No. 201611101244.4, dated May 7, 2020, 6 pages (with English translation).

\* cited by examiner

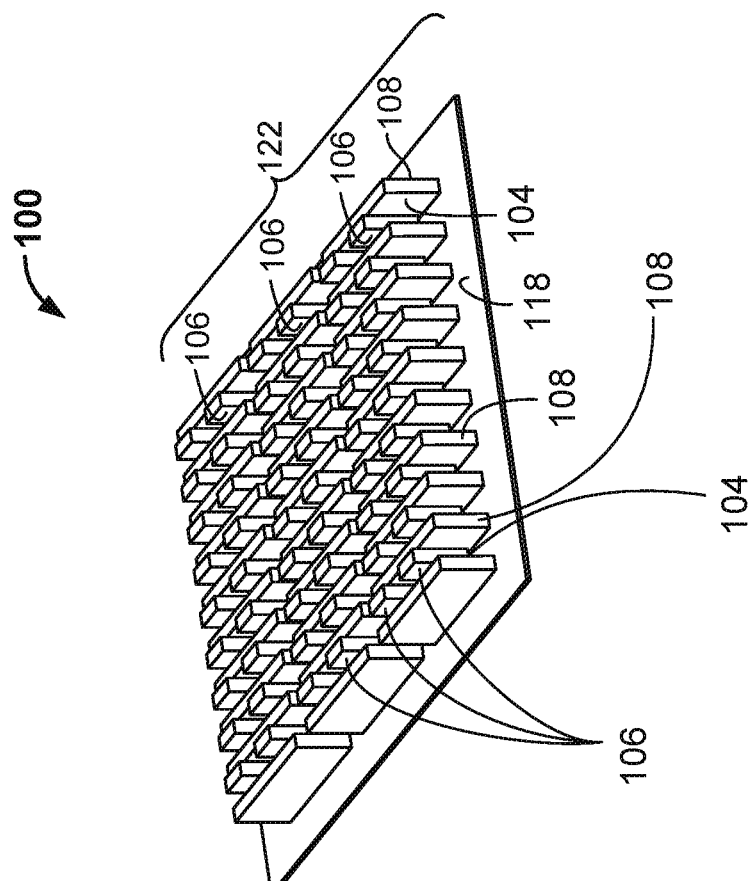
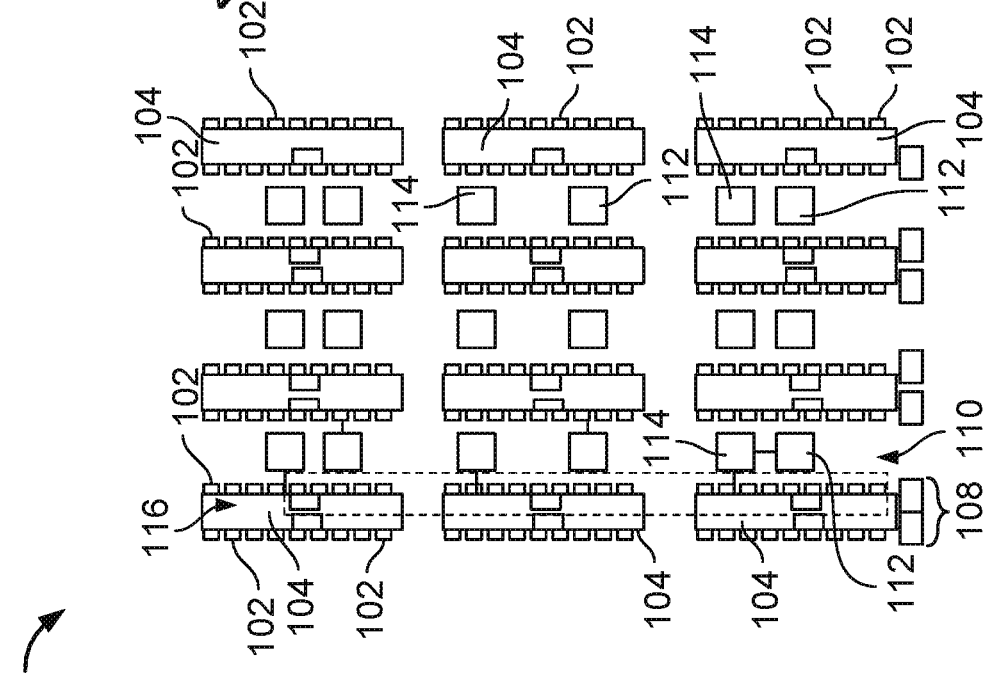
FIG. 1A
FIG. 1B

COOLING A DATA CENTER

CROSS-REFERENCE TO RELATED APPLICATION

This application is a divisional of, and claims priority under 35 U.S.C. § 120 to, U.S. patent application Ser. No. 14/956,595, filed on Dec. 2, 2015, the entire contents of the previous application is incorporated by reference herein.

TECHNICAL FIELD

The present disclosure relates to systems and methods for cooling data center systems and computing components.

BACKGROUND

Data centers house various computing systems and components such as computer processors, storage systems or drives, servers, and other computing components. A data center may take up a room in a building, an entire building itself and may be stationary in form or may be portable, for example housed in a shipping container. A data center, whether stationary or portable, may also be modular. The computer related components housed in a data center consume significant amounts of electrical power and thereby produce significant amounts of heat during computing and storage operations. If the computer related components exceed certain temperatures, the performance of the components can be compromised and/or the components may fail. Accordingly, cooling systems are generally implemented to maintain proper and efficient functioning of the computer related components housed in a data center as the components operate to transfer, process, and store data. The cooling systems may include components configured to move fluids such as air or liquid through various configurations and based on varying conditions.

SUMMARY

The present disclosure describes implementations of data center cooling systems and related apparatuses, components, and systems. In a particular implementation, the data center cooling system includes a plurality of server racks aligned within a row in a human-occupiable workspace of a data center, the server racks supporting a plurality of heat-generating computing devices; a warm air aisle positioned adjacent the server racks opposite the human-occupiable workspace and including a warm air inlet adjacent to a back side of the row of server racks and a warm air outlet in fluid communication with a warm air plenum; a plurality of cooling modules each including at least one fan and a cooling coil, the cooling modules positioned to circulate a cooling airflow from the human-occupiable workspace, through the server racks, and to the warm air aisle; and a controller communicably coupled to each of the plurality of cooling modules and operable to perform operations including controlling the plurality of fans in the plurality of cooling modules to operate at a specified fan speed, and controlling a plurality of valves fluidly coupled to the plurality of cooling coils in the plurality of cooling modules to modulate to a specified valve position.

An aspect combinable with this particular implementation further includes a plurality of temperature sensors positioned on the plurality of cooling modules.

In another aspect combinable with any of the previous aspects, the plurality of temperature sensors are configured to determine a cooling coil entering air temperature and a cooling coil leaving air temperature.

In another aspect combinable with any of the previous aspects, the plurality of temperature sensors are configured to determine a cooling coil entering cooling liquid temperature and a cooling coil leaving cooling liquid temperature.

In another aspect combinable with any of the previous aspects, controlling the plurality of fans in the plurality of cooling modules includes operating at the specified fan speed based, at least in part, on a temperature of a cooling module in the plurality of cooling modules.

In another aspect combinable with any of the previous aspects, controlling one of the plurality of fans and the plurality of valves is based on a differential pressure calculated across the warm air aisle.

Another aspect combinable with any of the previous aspects further includes a plurality of filler panels configured to isolate the human occupiable workspace from the warm air aisle.

In another aspect combinable with any of the previous aspects, the warm air aisle is inside a heat containment structure at least partially defined by the plurality of filler panels.

Another aspect combinable with any of the previous aspects further includes a plurality of temperature sensors coupled to the heat containment structure.

In another aspect combinable with any of the previous aspects, controlling the plurality of fans includes individually controlling each fan in the plurality of fans to a specified rotational speed.

In another aspect combinable with any of the previous aspects, controlling the plurality of fans includes actuating all the fans in the plurality of fans together at the same speed.

Another aspect combinable with any of the previous aspects further includes a network interface communicably coupled to the controller for remotely configuring the controller.

In another aspect combinable with any of the previous aspects, each cooling module in the plurality of cooling modules includes a power input interface configured for coupling to a power source and a power output interface coupled to the controller.

In another aspect combinable with any of the previous aspects, the cooling module includes a transformer circuit configured to convert AC current to DC current.

In another aspect combinable with any of the previous aspects, the transformer is configured to reduce the voltage of the AC current.

In another aspect combinable with any of the previous aspects, the cooling conduits of the plurality of cooling modules are serially fluidly coupled.

In another particular implementation, a method for controlling a plurality of cooling modules includes sensing a differential pressure calculated across the warm air aisle; controlling the plurality of fans in the plurality of cooling modules based on the differential pressure to operate at a specified fan speed; sensing a plurality of temperatures in the plurality of cooling modules; and controlling a plurality of valves fluidly coupled to the plurality of cooling coils in the plurality of cooling modules to modulate to a specified valve position based at least in part on the plurality of temperatures. Each module includes at least one fan and a cooling coil positioned to circulate a cooling airflow from a human-occupiable workspace, through a plurality of server racks, and to a warm air aisle positioned adjacent the server racks opposite the human-occupiable workspace and including a warm air inlet adjacent to a back side of the row of server racks and a warm air outlet in fluid communication with a warm air plenum.

An aspect combinable with this particular implementation further includes sensing a plurality of temperatures includes sensing a cooling liquid entering temperature and a cooling liquid leaving temperature.

In another aspect combinable with any of the previous aspects, sensing a plurality of temperatures includes sensing an entering air temperature and a leaving air temperature.

In another aspect combinable with any of the previous aspects, controlling a plurality of valves includes controlling a plurality of valves based on a water entering temperature, a water leaving temperature, an air entering temperature, and an air leaving temperature.

In another particular implementation, a data center power system includes a plurality of server racks aligned within a row in a human-occupiable workspace of a data center, the server racks supporting a plurality of heat-generating computing devices; a warm air aisle positioned adjacent the server racks opposite the human-occupiable workspace and including a warm air inlet adjacent to a back side of the row of server racks and a warm air outlet in fluid communication with a warm air plenum; a plurality of cooling modules positioned to circulate a cooling airflow from the human-occupiable workspace, through the server racks, and to the warm air aisle; a control power bus electrically coupled to each of the transformers of the plurality of cooling modules to receive direct current (DC) power transformed from the AC power; and a controller electrically powered by the control power bus and communicably coupled to each of the plurality of cooling modules to control the plurality of fans in the plurality of cooling modules to operate at a specified fan speed. Each of the plurality of cooling modules includes at least one fan; a main power bus electrically coupled to the at least one fan and to a main power source to receive alternating current (AC) power; and a transformer electrically coupled with the main power bus.

In an aspect combinable with this particular implementation, the controller is electrically coupled to receive DC power from a first transformer of the plurality of transformers, through the control power bus, independently of a loss of AC power to a second transformer of the plurality of transformers.

In another aspect combinable with any of the previous aspects, at least one sensor associated with a first cooling module is electrically coupled to the control power bus to receive DC power from a transformer, through the control power bus, associated with a second cooling module.

In another aspect combinable with any of the previous aspects, the controller is configured to adjust an operation of the fan associated with the second cooling module based on a loss of power to the sensor associated with the first cooling module.

Implementations of the data center cooling systems described herein may include one, some, or all of the following features. For example, implementations permit controller powering without failure if a power providing cooling module fail. Additionally, implementations allow high voltage AC for powering cooling modules to be used for powering low voltage controllers and sensors in the absence of additional powering sockets. Furthermore, implementations also permit scalability of single controllers for control and monitoring of larger areas. As another example, loss of power (e.g., main power to a fan) to one or more cooling modules may not result in a loss of power to one or more sensors that evaluate a health of the cooling system (or that particular cooling module(s)), as the sensors may receive power from a controller separate from the lost power. In some examples, loss of power (e.g., main power to a cooling module) may seamlessly permit a controller (e.g., for a cooling module) to be powered without interruption from a neighboring or adjacent module. As another example, a failure of a sensor (e.g., pressure or temperature) for a particular cooling module may not result in failure of that cooling module, as the desired measurement may be used from a neighboring or adjacent sensor(s), which as a result, may proportionally be compensated in neighboring cooling modules. In addition, implementations permit cooling without interruption (e.g., long enough to cause damage due to lack of cooling) even if a cooling module were to fail due to power or controller failures.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features.

FIGS. 1a and 1b illustrate a data center including fan coil units and hot containment structures, in accordance with example implementations of data center cooling systems.

Figure 2:
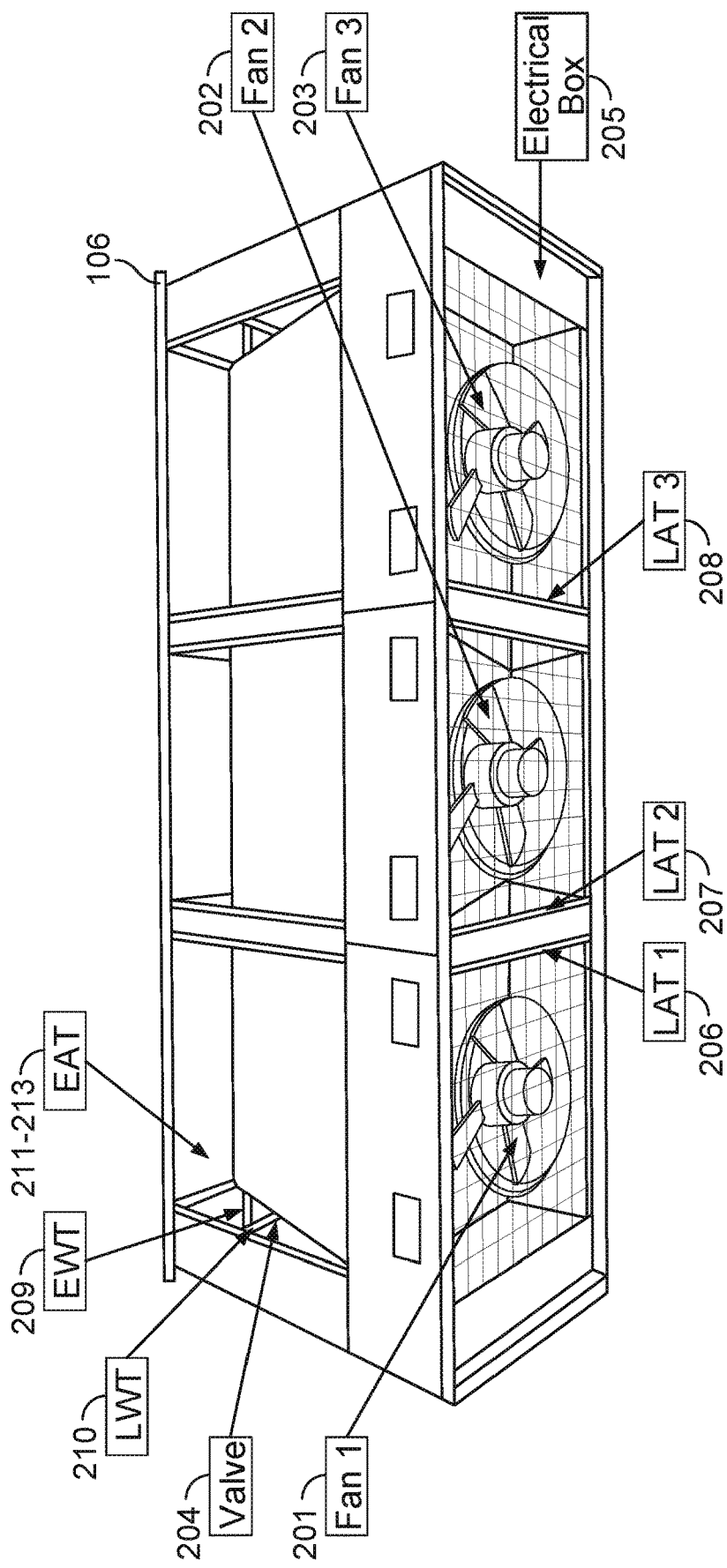
FIG. 2 shows a fan coil unit including air and water sensors for temperature control of the fan coil unit, in accordance with example implementations of data center cooling systems.

The features and advantages of the inventive concepts disclosed herein will become more apparent from the detailed description set forth below when taken in conjunction with the drawings.

DETAILED DESCRIPTION

Following below are more detailed descriptions of various concepts related to, and exemplary embodiments of, inventive systems, methods, and components of data center cooling systems and related apparatuses, components, and systems.

FIGS. 1a and 1b illustrate a data center including fan coil units and hot containment structures, in accordance with example implementations of data center cooling systems. FIG. 1a illustrates a top view of a data center 100, which includes, but is not limited to, a portable modular data center. The portable modular data center may be implemented as a mobile containment structure, in accordance with particular embodiments. The mobile containment structure may be configured for coupling to a trailer or may include wheels for movement by truck. In other implementations, the data center 100 may be implemented as a stationary room or may occupy an entire building.

FIG. 1b illustrates a perspective view of the data center 100. The data center 100 includes a plurality of server racks 102 holding a plurality of servers therein. The servers in server racks 102 may be implemented for processing, transmitting and/or storing data. The servers may include other computing devices or components related to the operation of the servers. The servers, computing devices, and related components include heat-generating computing devices that generate heat as the devices operate to process, transmit, and store data locally and with remote computing systems. The servers may, for example be connected to a local or remote network and may receive and respond to various requests from the network to retrieve, process, and/or store data. The servers may facilitate communication over the Internet or an intranet to permit interaction with a plurality of remote computers and to provide requested services via applications running on the remote computers or on the servers. Accordingly, the data center 100 includes one or more power source for powering the servers and related components and includes a communication interface which may be configured for wired and wireless transmissions to and from the data center 100. The power source may be connected to a power grid or may be generated by batteries or an on-site generator.

The server racks 102 are positioned, at least in part, in the cold aisle 110 with the backs of the server racks 102 positioned against a hot air containment structure 104. The hot air containment structure 104 includes openings configured to receive or be positioned adjacent to the backs of the server racks 102. The cold air aisles 110 include human-occupiable workspaces of the data center 100. Accordingly, someone servicing the data center 100 may walk through the cold air aisle 110 to access, repair, replace, add, or service a server or other related components positioned in the server racks 102. The cold air aisle also provides access to other components of the data center 100, including the cooling components, power interfaces, power sources, and other components and systems. In certain embodiments, each of the server racks 102 includes a plurality of server subassemblies, which may be removably coupled to the server rack 102. The server racks 102 may themselves also be configured for attachment to and removal from the hot air containment structure.

In the illustrated embodiments, the data center 100 includes hot air containment structures 104 positioned in rows of three; however, the data centers 100 may include hot air containment structures 104 configured in rows 122 including two or more hot air containment structures 104, configured for operation with a single programmable logic controller (PLC) panel. The single PLC panel, includes two PLCs 108, in accordance with example implementations, as discussed further herein. In certain implantations, each row 122 of server racks 102 provides, e.g., around 1 MW of IT load, and includes three (3) hot air containment structures 104 positioned between the racks 102. In other implementations, the IT load may be, for example, 0.5 MW, 2 MW, 3 MW, 5 MW, or 7 MW.

The hot air containment structures 104 and the server racks 102 are positioned on a floor 118 of the data center 100. The floor 118 may include a sub floor of the mobile container or room, in accordance with example implementations. The subfloor may be raised from the actual floor and may be used to route wires, cables, or may be used for air flow routing in certain implementations. Cold air intake 120 is pulled through the server racks 102 from the cold air aisle 110 into the respective hot air containment structure 104. In accordance with example embodiments, the server racks 102 and one or more filler panels and/or doors (not shown) isolate the cold air aisle 110 from the hot air containment structure and related hot air exhaust or return plenum. The hot air exhaust travels up the hot air containment structure 104 and into the fan coil units 106 via hot air ducts 112 where the hot air is cooled and exhausted back into the cold air aisle 110 via cold air ducts 114 as discussed further herein.

In accordance with example embodiments, the fan coil units 106 cool the hot air exhaust via cooled liquid flowing through the fan coil units 106. The fan coil units 106 include fans for drawing hot air into the fan coil units 106. Fans of the fan coil units 106 move the hot air exhaust across cold liquid containing coils or fins within the fan coil units 106. The fans exhaust the cooled air into the cold air aisle 110 for reentry into the hot air containment structure 104 so that the cooled air can continue to cool the servers in the server racks 102. The fan coil units 106 are configured to regulate the pressure and temperature between the cold aisles 110 and the hot aisles 116.

FIG. 2 shows a fan coil unit 106 including air and water sensors for temperature control of the fan coil unit, in accordance with example implementations of data center cooling systems. As discussed further herein, a plurality of fan coil units 106 is controlled via a single controller 108. The single controller 108 is positioned on one of the hot air containment structures 104 at an end of the row, in certain implementations. The controller 108 is configurable via a graphical touchscreen interface, in certain implementations. The controller 108 may also be accessed and configured remotely via a wireless network, in certain implementations.

The single controller 108 is configured to adjust water and airflow rates and temperatures for a plurality of fan coil units 106. In particular, the single controller 108 is configured to adjust water and airflow rates and temperatures for all of the fan coil units 106 in the respective row 122 in the data center 100. As described further herein, the fan coil units 106 in row 122 are daisy chained, serially connected to one another by power, communication, or both, in certain implementations. The controller 108 adjusts the water and airflow rates and temperatures for the plurality of fan coil units 106, for example, based on the local temperatures of each individual fan coil unit 106 in the respective row 122. Each row 122 of fan coil units 106 may be daisy chained to a distinct bus duct and two bus ducts may be implemented with a row of hot air containment structures 104, in accordance with particular implementations. Each fan coil unit 106 is coupled to a hot air containment structure 104. In certain embodiments, the fan coil unit 106 is coupled to the top of the hot air containment structure 104, for example via one or more brackets or fasteners.

As illustrated in FIG. 2, the fan coil unit 106 includes 3 electrical fans 201-203, a valve(s) 204, and an electrical box 205 communicably coupling the fans 201-203 and valve(s) 204 to controller 108 and a plurality of pressure and temperature sensors. The electrical fans 201-203 control the intake flow of hot air into the fan coil unit 106 and the exhaust flow of cooled air out of the fan coil unit 106. The cooled air is drawn past the server racks 102 for cooling the servers positioned thereon through apertures in the hot air containment structure 104 and into the hot air containment structure 104.

Heat is transferred from the heat generating computing device on the server racks 102 to the cooled air as the cooled air passes the server racks 102 and enters the hot air containment structure 104. Accordingly, the cooled air is heated by the heat generating computing device on the server racks 102 as it enters the hot air containment structure 104. The cooled air is drawn into the hot air containment structure 104 on multiple sides. The ends of the hot air containment structure 104 may be closed via a panel, door, or wall (e.g., 310 of FIG. 3) of the hot air containment structure 104. The heated air is then exhausted from the hot air containment structure 104, for example, via an exhaust duct at or near the top of the hot air containment structure 104. The exhaust hot air then enters the fan coil unit 106 for cooling via cold water flowing through the fan coil unit 106.

The valve(s) 204 controls the flow of cooling water into and out of the fan coil unit 106. The cooling water is cooled via one or more condensers or coolers and is pumped into the fan coil unit 106 for cooling hot air exhaust received from the hot air containment structure 104 and into the fan coil unit 106. In certain embodiments, a refrigerant may be used instead of or in addition to cooling water. In certain embodiments, conduits for cooling fluid in one fan coil unit 106 is coupled to a conduit for cooling fluid in an fan coil unit 106 coupled to another hot air containment structure 104 positioned in the same row 122. Accordingly, cooling fluid flows between the fan coil units 106 in the row 122 before returning to the water cooler or condenser. The hot air exhaust received into the fan coil unit 106 is circulated over one or more fluid conduits or radiator fins through which the cooling water is flowing. As the hot air exhaust flows across the conduits containing the cooling fluid, the hot air exhaust is cooled and exhausted from the fan coil unit 106.

The controller 108 determines and/or monitors, via a plurality of sensors, including, but not limited to, thermistors, the air temperature of cooled air leaving the fan coil unit 106. The air temperature of cooled air leaving the fan coil unit 106 is monitored via LAT (leaving air temperature) sensors 206-208. The controller 108 determines and/or monitors, via a plurality of sensors, including, but not limited to, thermistors, the air temperature of hot air leaving the fan coil unit 106. The air temperature of hot air entering the fan coil unit 106 is monitored via, EAT (entering air temperature) sensors 211-213. The controller 108 determines and/or monitors, via a plurality of sensors, including, but not limited to, thermistors, the water temperature of cooling water entering the fan coil unit 106. The water temperature of cooled water entering the fan coil unit 106 is monitored via EWT (entering water temperature) sensor 209. The cooling water enters via valve(s) 204. The controller 108 determines and/or monitors the water temperature of cooling water leaving the fan coil unit 106 via valve(s) 204 by checking the LWT (leaving water temperature) sensor 210, of water leaving the fan coil unit 106.

In certain implementations all of the temperature sensors, the EAT sensors 211-213, the LAT sensors 206-208, the EWT sensor 209, and the LWT sensor 210, are located on the fan coil unit 106. In certain implementations, the controller 108 is configured to actuate all of fans 206-208 together at the same speed. In certain implementations, the controller 108 is configured to actuate all of the fans 206-208 independently, whereby all of the fans of the plurality of fan coil units 106 in the row 122 may be individually controlled as warranted. As shown in FIG. 2, the EWT sensor 209 is located near (or coupled to) piping coming from a condenser, whereas the LAT sensors 206-208 are spread out near each of fans 201-203 of the fan coil unit 106. The temperature sensors 206-208 and 209 are used to control the approach temperature (LAT-EWT) by adjusting water flow rate with the valve(s) 204 of the fan coil unit 106. The water flow rate is adjusted independently on each fan coil unit 106 in the row 122. The position of the valve(s) 204 is controlled with a 2-10V analog signal through a remote sensor box.

In certain embodiments, the fan coil unit 106 includes a power connection in the electrical box 205. The power connection may be coupled to a power source powering multiple fan coil units 106, for example, the fan coil units in a row 122, for power redundancy. The power connection also permits powering all of the supporting equipment with a single high voltage AC power input that powers each of the fan coil units. The single high voltage AC power is converted to low voltage DC power in the electrical box 205 for powering the remote telemetry boxes (e.g., the remote sensor box 306 illustrated in FIG. 3), the controller 108.

In such implementations, each fan coil unit 106 is individually powered and down converts AC power to DC power. The DC power from each fan coil unit 106 is then recombined along a low voltage DC bus with a diode network in order to power the remote telemetry boxes (e.g. the remote sensor box 306 illustrated in FIG. 3) and the controller 108. This configuration permits the single controller 108 to be powered without permitting outages to the controller 108 in the case where any one of the fan coil units 106 in the row 122 fails. Accordingly, the remote sensors and the controllers 108 also free up a data center power socket, which can instead be allocated to powering a server rack 102.

For example, in some implementations, one or more individual fan coil units 106 may lose power, such as from a blown fuse. In such implementations, the controller 108 may remain powered since both may be powered from the same AC bus. Further, in some implementations, the controller 108 may include or be electrically coupled to a back-up power source (e.g., battery, solar, flywheel, or otherwise). Thus, even in situations where main power is lost to the controller 108, telemetry boxes (e.g., remote sensor box 306) may be operable and monitored, e.g., to determine or measure an increased heat load due to operating electronic equipment (e.g., servers).

Figure 3:
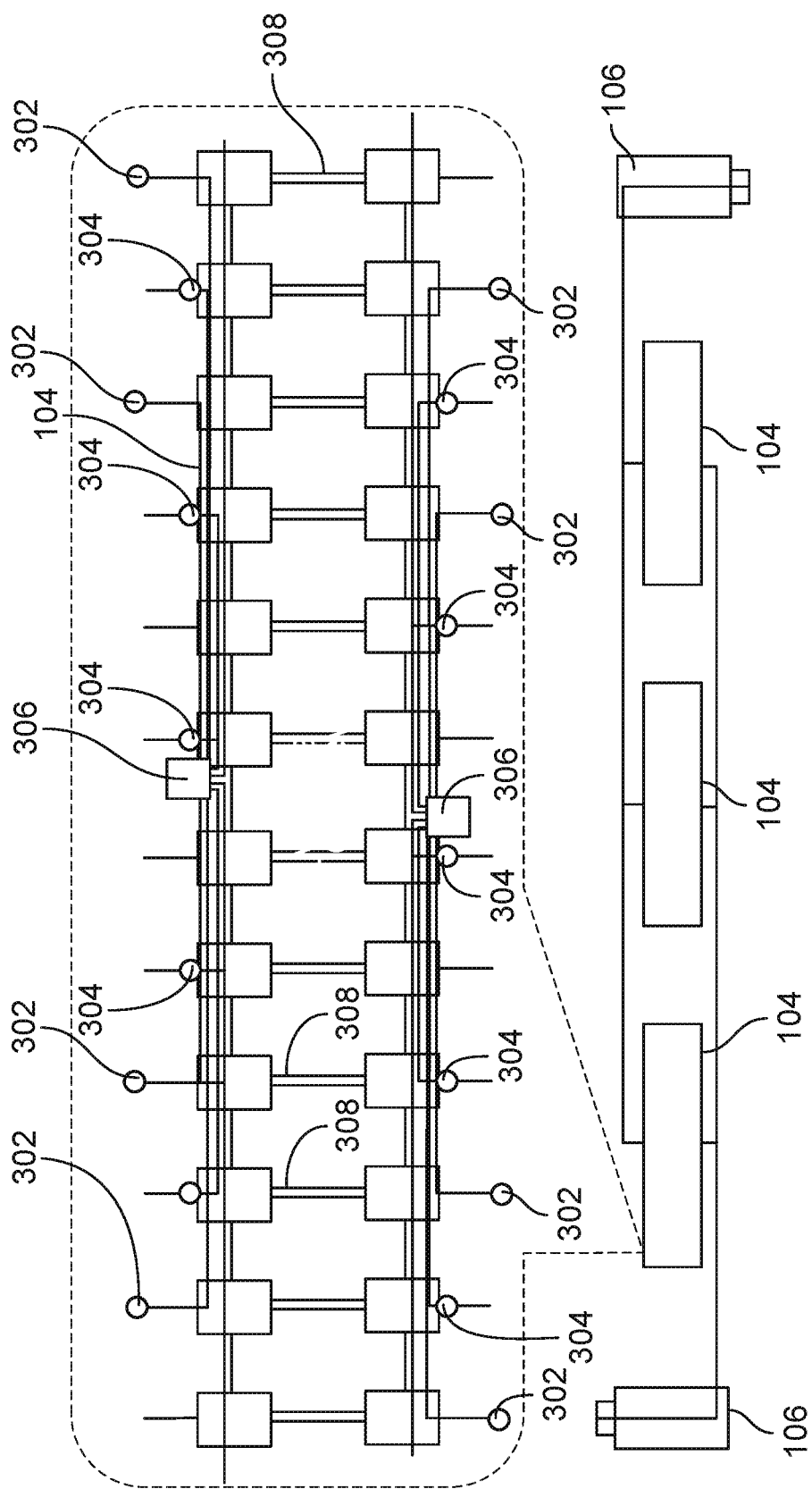
FIG. 3 illustrates differential pressure sensor taps and cold aisle temperature sensors for a hot air containment structure of example implementations of data center cooling systems.

FIG. 3 illustrates differential pressure sensor taps and cold aisle temperature sensors for a hot air containment structure of example implementations of data center cooling systems. Each of the hot air containment structures 104 includes a plurality of sensors (e.g., thermistors) 302 for detecting temperatures in the hot air containment structures 104. The sensors 302 are electrically coupled to a remote sensor box 306, which is communicably coupled to the controller 108. Each of the hot air containment structures 104 includes plurality of differential pressure sensors 306, which are also electrically coupled to a remote sensor box 306, which is communicably coupled to the controller 108. While both the thermistors 302 and the differential pressure sensors 306 are used for monitoring, only the differential pressure sensors are used for controlling fan speeds in the fan coil units 106 in certain implementations. In particular, the differential pressure sensors 302 are used to compute a characteristic pressure for controlling the fan speeds of the fans, 206-208 of the fan coil unit 106 (which may be positioned above the hot air containment structures 104, at ends of rows of racks, or otherwise).

Each PLC controller 108 monitors differential pressures across the cold aisle 110 and hot plenum 116 for the three hot containment structures 104 in its row 122. Differential pressure sensors 302 are located inside remote pressure sensors boxes, but tubing 308 fans out to taps located on each upright on the hot containment structures 104. As demonstrated in FIG. 3, the differential pressure sensors 302 are connected via tubing connection 308 to the cold aisle 110 and the hot air containment structure 104 to monitor differential pressure across the cold aisle 110 and the hot air containment structure 104. The tubing may be coupled to an upright surface on the hot air containment structure 104. In certain implementations, half of the pressure sensors are routed to each of the air containment structures 104 on each side of the air containment structure 104 and are coupled to the controller 108. The configuration provides redundant monitoring in the event that a single controller 108 fails. The differential pressure sensors 302 provide sensor measurements that are combined to create a characteristic differential pressure that is used to control the fans 206-208 for the plurality of fan coil units 106 distributed along each row 122.

Each controller 108 is configured for controlling two sets of control loops. The first control loop that each controller 108 is configured for controlling includes temperature control. The temperature control may be facilitated by adjusting the valve position to control the cooling liquid (e.g., chilled liquid, condenser liquid, refrigerant, or otherwise) flow for each fan coil unit 106. The second control loop that each controller 108 is configured for controlling includes differential pressure control. The differential pressure may be controlled by adjusting blower speeds for all of the fan coil units 106 in the row 122 together, in certain embodiments.

Figure 4:
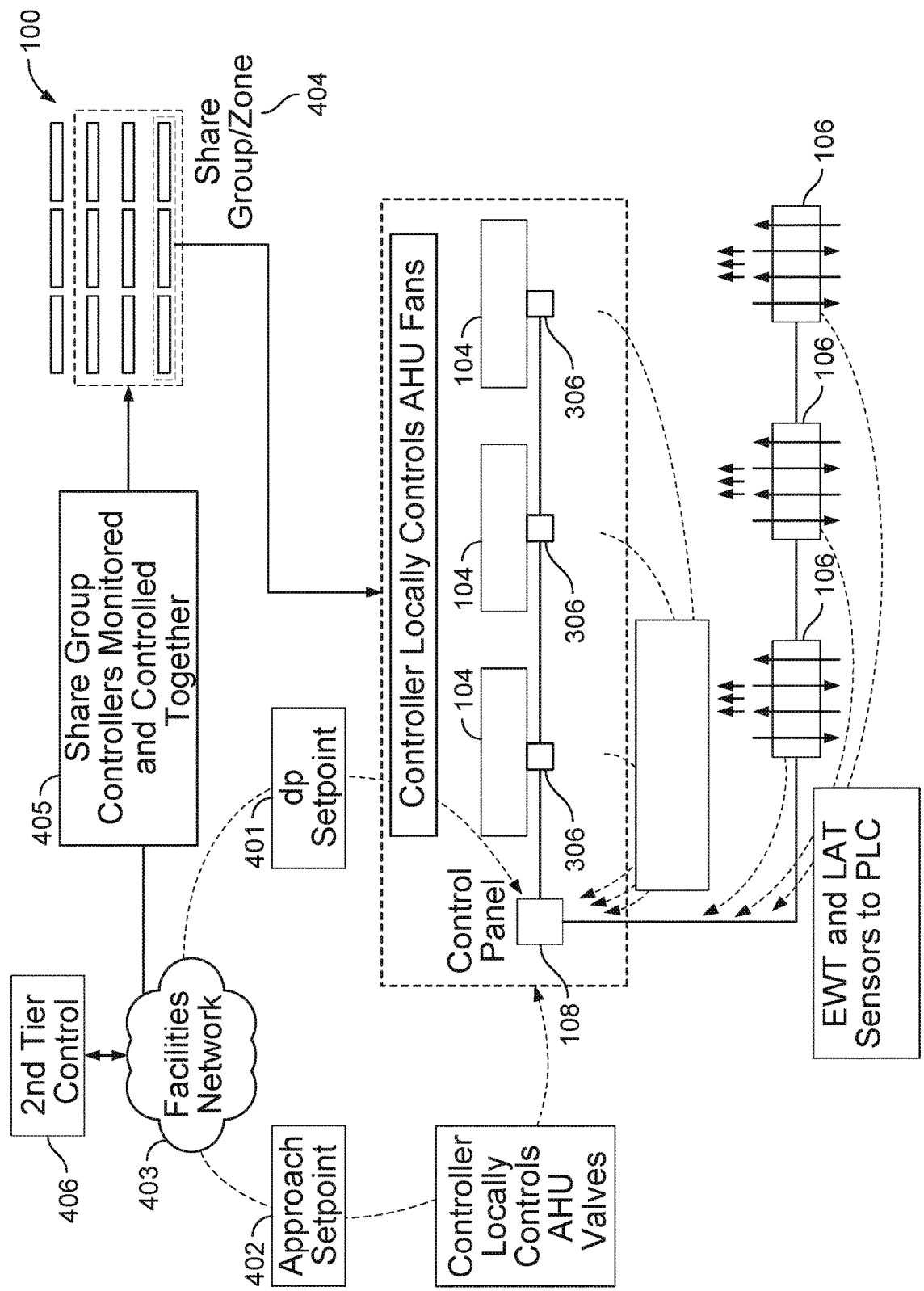
FIG. 4 is a schematic diagram of control systems implemented for operations of data center cooling systems, in accordance with example implementations.

FIG. 4 is a schematic diagram of control systems implemented for operation of a data center cooling system, in accordance with example implementations. Airflow and temperature are controlled by a distributed network of controllers 108, one per row of fan coil units 106 and are located on the front face of the first hot air containment structure 104 of that row. Each PLC controller 108 operates autonomously to satisfy its local pressure and temperature set points, which control is based on remote pressure sensors on the hot air containment structures 104 and temperature sensors on the fan coil units 106 in the corresponding row. In particular embodiments, all of the sensors, including the pressure and temperature sensors communicate with the respective controller 108 via, e.g., Modbus RTU over RS485. As demonstrated in FIG. 4, the pressure and temperature sensors of the hot air containment structure 104 communicate with the controller 108 via the remote sensor boxes 306. The temperature sensors of the fan coil units 106 also communicate with the controller 108. The controller 108 processes the sensor data from the remote sensor boxes 306 and the fan coil units 106 sensors to control the fans and valves of the fan coil units 106 locally.

In certain implementations, configuration of the controllers 108 may be updated over Ethernet and persistent. Accordingly, a network connection may be implemented for configuration and optimal control of the controllers 108. After configuration of the controllers 108, a network connection may be further implemented, but the data center cooling system 100 will enter a safe state if the network connection is briefly lost.

As demonstrated in FIG. 4, a cloud based 2nd tier controller 406 (e.g., a building automation system or other main control system) communicates dynamic set points 401 and operational regimes, such as the approach set point 402, to each PLC controller 108 independently to balance airflow and temperature in the data center facility as a whole, in accordance with particular implementations. The 2nd tier controller 406 communicates the set points to the controller 108 via network 403. The 2nd tier controller 406 adjusts the facility monitoring infrastructure to adjusts the set points of the local PLC controller 108 in real-time. The objective of operation of the 2nd tier controller 406 is to handle airflow in the case of failure of a fan coil unit 106 within a share zone and to trim fan speeds. In certain implementations, the local controllers 108 may be configured to communicate with one another or to operate under the shared regime of share group controller 405. The share group controller 405 is configured to control the fan coil units in a plurality of rows identified by share zone 404.

Share zones 404 (or share groups) are air sharing domains where fan coil units 106 are controlled as a group with the 2nd tier controller 406. In certain implementations, the share zones 404 are grouped in, e.g., 3 MW domains, and the share zones 404 can be anywhere from several rows to an entire site, depending on the control granularity and operational requirements (e.g., operating costs, operating efficiencies, and otherwise). In some alternative examples, the domains may provide for smaller IT loads, e.g., 0.5 MW, 1 MW, 2 MW, or greater IT loads, e.g., 1.5 MW, 4 MW, 9 MW, or otherwise.

The 2nd tier controller 406 monitors fan speeds of all active fan coil units 106 in a particular share zone 404 (standby units ignored) and uses the values of those active fan coil units to adjust local set points of the PLC controller 108. The values are collected and set the facilities network 403, in addition to all other monitored and configurable parameters on the PLC controller 108.

In certain implementations, fan coil pressure controls operate in one of the following modes: (1) a normal (auto) fan mode, where fan speeds controlled by the PLC using a calculation of enabled differential pressure sensors 304, (2) a manual override mode, where failsafe conditions are manually set, (3) a controller 108 failsafe fan mode, where the fans 206-208 of each fan coil unit 106 are operated at max speed by the controller 108 in the event of a sensor failure, (4) a fan failsafe mode, where the fan defaults to a last open position when communication with the controller 108 is lost, and (5) an operator mode, where an operator interface is engaged by user (for example to verify and test operations.

In certain implementations, fan coil temperature controls operate in one of the following modes: (1) a normal (auto) valve mode where the valves 204 are normally controlled off of the approach setpoint, are controlled off of LAT during extremely low LAT and high EWT conditions (adjustable), (2) and a manual override mode, where failsafe conditions can be set, (3) a failsafe (valve open) mode where the valve is controlled to a failsafe position, (4) a communication failsafe (valve stops) mode where the valves remain in their last known position if the controller 108 loses communication with the valve 204, (5) an operator mode, where an operator interface is enabled, for example, for verification and testing.

Embodiments of the subject matter and the operations described in this specification can be implemented by digital electronic circuitry, or via computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus.

A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., a FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's user device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a user computer having a graphical display or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include users and servers. A user and server are generally remote from each other and typically interact through a communication network. The relationship of user and server arises by virtue of computer programs running on the respective computers and having a user-server relationship to each other. In some embodiments, a server transmits data (e.g., an HTML, page) to a user device (e.g., for purposes of displaying data to and receiving user input from a user interacting with the user device). Data generated at the user device (e.g., a result of the user interaction) can be received from the user device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

For the purpose of this disclosure, the term "coupled" means the joining of two members directly or indirectly to one another. Such joining may be stationary or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It should be noted that the orientation of various elements may differ according to other exemplary embodiments, and that such variations are intended to be encompassed by the present disclosure. It is recognized that features of the disclosed embodiments can be incorporated into other disclosed embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed is:

1. A method for controlling a plurality of cooling modules each comprising at least one fan and a cooling coil positioned to circulate a cooling airflow from a human-occupiable workspace, through a plurality of server racks, and to a warm air aisle positioned adjacent the server racks opposite the human-occupiable workspace and comprising a warm air inlet adjacent to a back side of the row of server racks and a warm air outlet in fluid communication with a warm air plenum, the method comprising:
    sensing a differential pressure calculated across the warm air aisle;
    controlling, with a single controller electrically and communicably coupled to each of the plurality of cooling modules in a serial arrangement, the plurality of fans in the plurality of cooling modules based on the differential pressure to operate at a specified fan speed;
    remotely configuring the single controller through a network interface communicably coupled to the single controller;
    sensing a plurality of temperatures in the plurality of cooling modules;
    controlling a plurality of valves fluidly coupled to the plurality of cooling coils in the plurality of cooling modules to modulate to a specified valve position based at least in part on the plurality of temperatures;
    converting alternating current (AC) power to direct current (DC) power at one of the cooling modules; and
    providing DC power to the single controller from one of the plurality of cooling modules through a DC control power bus independently of a loss of power to the other cooling modules of the plurality of cooling modules.

2. The method of claim 1, wherein sensing a plurality of temperatures comprises sensing a cooling liquid entering temperature and a cooling liquid leaving temperature.

3. The method of claim 1, wherein sensing a plurality of temperatures comprises sensing an entering air temperature and a leaving air temperature.

4. The method of claim 1, wherein controlling a plurality of valves comprises controlling a plurality of valves based on a water entering temperature, a water leaving temperature, an air entering temperature, and an air leaving temperature.

5. The method of claim 1, wherein controlling the plurality of valves comprises controlling a plurality of valves based on at least one of a water entering temperature, a water leaving temperature, an air entering temperature, or an air leaving temperature.

6. The method of claim 1, further comprising controlling one of the plurality of fans and the plurality of valves based on a differential pressure calculated across the warm air aisle.

7. The method of claim 1, further comprising fluidly isolating the human occupiable workspace from the warm air aisle with plurality of filler panels.

8. The method of claim 7, wherein the warm air aisle is inside a heat containment structure at least partially defined by the plurality of filler panels.

9. The method of claim 8, further comprising sensing a plurality of temperatures at the heat containment structure.

10. The method of claim 1, wherein controlling the plurality of fans comprises individually controlling each fan in the plurality of fans to a unique rotational speed.

11. The method of claim 1, wherein controlling the plurality of fans comprises actuating all the fans in the plurality of fans together at the same speed.

12. The method of claim 1, further comprising supplying alternating current (AC) power from a power source to the plurality of cooling modules, each of the plurality of cooling modules comprising a power output interface electrically coupled to the single controller.

13. The method of claim 1, further comprising supplying the DC power to the single controller through the DC control power bus.

14. The method of claim 1, wherein the plurality of cooling modules are serially fluidly coupled by cooling conduits.

15. The method of claim 1, wherein sensing the plurality of temperatures comprises sensing a cooling liquid entering temperature, a cooling liquid leaving temperature, an entering air temperature, and a leaving air temperature.

16. The method of claim 15, wherein controlling a plurality of valves comprises controlling a plurality of valves based on a water entering temperature, a water leaving temperature, an air entering temperature, and an air leaving temperature.

17. The method of claim 15, wherein sensing the cooling liquid entering temperature, the cooling liquid leaving temperature, the entering air temperature, and the leaving air temperature comprises sensing the cooling liquid entering temperature, the cooling liquid leaving temperature, the entering air temperature, and the leaving air temperature with sensors mounted on the cooling module.

18. The method of claim 1, wherein controlling the plurality of valves comprises controlling the plurality of valves mounted at the plurality of cooling modules.

19. The method of claim 1, wherein sensing the plurality of temperatures comprises sensing a cooling liquid entering temperature, a cooling liquid leaving temperature, an entering air temperature, and a leaving air temperature.

20. The method of claim 19, wherein controlling a plurality of valves comprises controlling a plurality of valves based on a water entering temperature, a water leaving temperature, an air entering temperature, and an air leaving temperature.

21. The method of claim 19, wherein sensing the cooling liquid entering temperature, the cooling liquid leaving temperature, the entering air temperature, and the leaving air temperature comprises sensing the cooling liquid entering temperature, the cooling liquid leaving temperature, the entering air temperature, and the leaving air temperature with sensors mounted on the cooling module.

22. A method for controlling a plurality of cooling modules each comprising at least one fan and a cooling coil positioned to circulate a cooling airflow from a human-occupiable workspace, through a plurality of server racks, and to a warm air aisle positioned adjacent the server racks opposite the human-occupiable workspace and comprising a warm air inlet adjacent to a back side of the row of server racks and a warm air outlet in fluid communication with a warm air plenum, the method comprising:

sensing a differential pressure calculated across the warm air aisle;

controlling, with a single controller electrically and communicably coupled to each of the plurality of cooling modules in a serial arrangement, the plurality of fans in the plurality of cooling modules based on the differential pressure to operate at a specified fan speed;

sensing a plurality of temperatures in the plurality of cooling modules;

controlling a plurality of valves fluidly coupled to the plurality of cooling coils in the plurality of cooling modules to modulate to a specified valve position based at least in part on the plurality of temperatures, wherein the plurality of cooling modules are serially fluidly coupled by cooling conduits; and providing power to the single controller from one of the plurality of cooling modules through a direct current (DC) control power bus independently of a loss of power to the other cooling modules of the plurality of cooling modules.

23. The method of claim 22, wherein sensing a plurality of temperatures comprises sensing a cooling liquid entering temperature and a cooling liquid leaving temperature.

24. The method of claim 22, wherein sensing a plurality of temperatures comprises sensing an entering air temperature and a leaving air temperature.

25. The method of claim 22, wherein controlling a plurality of valves comprises controlling a plurality of valves based on a water entering temperature, a water leaving temperature, an air entering temperature, and an air leaving temperature.

26. The method of claim 22, wherein controlling the plurality of valves comprises controlling a plurality of valves based on at least one of a water entering temperature, a water leaving temperature, an air entering temperature, or an air leaving temperature.

27. The method of claim 22, further comprising controlling one of the plurality of fans and the plurality of valves based on a differential pressure calculated across the warm air aisle.

28. The method of claim 22, further comprising fluidly isolating the human-occupiable workspace from the warm air aisle with plurality of filler panels.

29. The method of claim 28, wherein the warm air aisle is inside a heat containment structure at least partially defined by the plurality of filler panels.

30. The method of claim 29, further comprising sensing a plurality of temperatures at the heat containment structure.

31. The method of claim 22, wherein controlling the plurality of fans comprises individually controlling each fan in the plurality of fans to a unique rotational speed.

32. The method of claim 22, wherein controlling the plurality of fans comprises actuating all the fans in the plurality of fans together at the same speed.

33. The method of claim 22, further comprising remotely configuring the single controller through a network interface communicably coupled to the single controller.

34. The method of claim 33, further comprising supplying alternating current (AC) power from a power source to the plurality of cooling modules, each of the plurality of cooling modules comprising a power output interface electrically coupled to the single controller.

35. The method of claim 34 further comprising converting AC power to DC power at one of the cooling modules.

36. The method of claim 35, further comprising supplying the DC power to the single controller through the DC control power bus.

37. The method of claim 22, wherein controlling the plurality of valves comprises controlling the plurality of valves mounted at the plurality of cooling modules.

\* \* \* \* \*